United States Patent
Clemons et al.

(10) Patent No.: US 7,142,002 B1
(45) Date of Patent: Nov. 28, 2006

(54) TEST HANDLER EMULATION

(75) Inventors: Mark E. Clemons, Westborough, MA (US); C. Kenneth Gray, West Newbury, MA (US); James D. Roblee, Salem, NH (US)

(73) Assignee: Northwave Equipment Corporation, Hudson, MA (US)

( * ) Notice: Subject to any disclaimer, the term of this patent is extended or adjusted under 35 U.S.C. 154(b) by 0 days.

(21) Appl. No.: 10/890,890

(22) Filed: Jul. 14, 2004

(51) Int. Cl.
*G01R 31/26* (2006.01)

(52) U.S. Cl. ..................................... 324/765

(58) Field of Classification Search ............... 324/765, 324/158.1, 760; 269/21, 30, 935, 937, 939–941
See application file for complete search history.

(56) References Cited

U.S. PATENT DOCUMENTS 5,708,222 A * 1/1998 Yonezawa et al. ......... 73/865.8
6,439,631 B1 * 8/2002 Kress ........................... 294/65
6,978,541 B1 * 12/2005 Feltner et al. ................ 29/840

* cited by examiner

*Primary Examiner*—Jermele Hollington
*Assistant Examiner*—Tung X. Nguyen
(74) *Attorney, Agent, or Firm*—Shane H. Hunter; T. J. Clark; Mintz, Levin, Cohn, Ferris, Glovsky and Popeo, P.C.

(57) ABSTRACT

A method of testing circuit chips includes providing test chips, the test chips being circuit chips to be tested, emulating a first type of test handler positioner for a circuit chip coupling device that is configured to couple to the first type of test handler, and using a test handler positioner connected to the circuit chip coupling device to couple the circuit chip coupling device to a selected test chip, to move the test chip to a desired test location, and to remove the test chip from the test location.

6 Claims, 5 Drawing Sheets

TEST HANDLER EMULATION

BACKGROUND OF THE INVENTION

Electronic equipment plays a large role in today's society, and in electronic equipment, electronic components such as integrated semiconductor circuits play a large role. Hundreds of thousands of integrated circuit chips are produced every year. New chips are constantly being designed to provide for faster, more powerful electonic devices to satisfy consumer demand and to provide new technologies to a tech-hungry consumer base.

As new semiconductor chips are designed, they need to be tested and test handlers are tools that automate the testing of semiconductor chips. There are many manufacturers of test handlers and these test handlers are designed and used as production tools, usually used in high volume environments.

High-volume semiconductor manufacturers are geographically dispersed, as are their chip design centers. Depending on their size and other factors, chip manufacturers may have many locations throughout the world where their chips are designed. High volume manufacturing may be performed at places where the design centers are located, but the overwhelming trend today is to have volume manufacturing performed in low labor rate areas of the world, decoupled from the design location. In addition, there is a trend for semiconductor manufacturers to utilize third party sources, or subcontractors to perform much of the volume testing of semiconductor chips. The subcontractors are also concentrated in low labor rate areas of the world. Therefore, usually, design centers are physically remote from high volume production facilities. In fact, a large chip manufacturer may have twenty or more design centers providing designs to twenty or more different manufacturing locations throughout the world. The permutations and combinations of where chips are designed and manufactured can be huge.

One of the roles of semiconductor chip design centers is to provide test programs and related hardware for newly-designed chips to the particular facility that will be manufacturing the electronic components in volume. This helps ensure that quality and reliability levels coming out of the production facilities will be in line with the results predicted by the design centers.

Testing and debugging the performance of the test program and related hardware that will be used at the production locations is another function of the design center. If the design centers do not already have the exact same high-volume test handlers as the production locations, the design centers purchase the same hardware as the production facility for the design centers. Each test handler manufacturer uses a unique set of hardware to effect the proper test of the semiconductor chip. Among other names, this hardware is called a work press by Synax, a blade pack by Seiko-Epson, or a nest by Delta Design® of San Diego, Calif. (a division of Cohu, Inc.), a puck, and possibly others, and is referred to below as a test piece coupler or chip coupler. The production handlers can be very expensive ($200K to $400K), and in a design center, their use is sporadic.

SUMMARY OF THE INVENTION

In general, in an aspect, the invention provides a method of testing circuit chips, the method including providing test chips, the test chips being circuit chips to be tested, emulating a first type of test handler positioner for a circuit chip coupling device that is configured to couple to the first type of test handler, and using a test handler positioner connected to the circuit chip coupling device to couple the circuit chip coupling device to a selected test chip, to move the test chip to a desired test location, and to remove the test chip from the test location.

Implementations of the invention may include one or more of the following features. The emulating includes providing mechanical and functional connections from the test handler positioner to the circuit chip coupling device. The functional connection includes a fluid communication connection, the method further comprising providing a vacuum from the test handler positioner to the circuit chip coupling device through the fluid communication connection. The test handler positioner is of a second type, different from the first type, that is incompatible for direct connection to the circuit chip coupling device.

In general, in another aspect, the invention provides a method of testing a circuit chip, the method including selecting a first coupling device that is configured to selectively connect to and disconnect from the circuit chip, the first coupling device being of a first type configured to mate with a corresponding first test handler positioner of the first type, connecting an emulation adapter to the first coupling device and to a second test handler positioner of a second type, different than the first type, the second test handler positioner being incompatible for direct connection to the first coupling device, using the second test handler positioner and the first coupling device to move the circuit chip to a test location, performing a test on the circuit chip, and using the second test handler and the first coupling device to remove the circuit chip from the test location.

Implementations of the invention may include one or more of the following features. The method further includes selecting a second coupling device that is configured to selectively connect to and disconnect from another circuit chip, the second coupling device being of a third type configured to mate with a corresponding third test handler positioner of the third type, and connecting another emulation adapter to the second coupling device and to the second test handler positioner. The second test handler positioner is compatible for direct connection to the second coupling device.

In general, in another aspect, the invention provides an emulation adapter for use with a semiconductor chip test handler, the emulation adapter being configured to mechanically connect to a test handler positioner of a first type and to a chip coupler for coupling to a semiconductor chip, the chip coupler being of a second type that is incompatible with direct connection to the test handler positioner of the first type, the emulation adapter being configured to directly connect to the test handler positioner of the first type and to directly connect to the chip coupler of the second type, the emulation adapter being further configured to provide fluid communication between the test handler positioner of the first type and the chip coupler of the second type by providing a passage through the emulation adapter with a first portion of the passage in alignment with a first opening provided by the test handler positioner of the first type and a second portion of the passage in alignment with a second opening provided by the chip coupler of the second type.

Implementations of the invention may include one or more of the following features. The emulation adapter includes a first plate configured to attach to the test handler positioner and a second plate configured to attach to the chip coupler. The first plate provides the first portion of the passage and the second plate provides the second portion of the passage, and wherein portions of the passage provided by the first and second plates overlap with the first and second plates connected to form portions of the emulation adapter. The emulation adapter further includes a gasket configured to be disposed between the first and second plates. At least one of the first and second plates is made of a thermally insulative material. The thermally insulative material is Garolite G11.

Implementations of the invention may also include one or more of the following features. The emulation adapter includes a compliance mechanism configured to connect to the chip coupler and to allow movement of the chip coupler relative to the test handler positioner to help the chip coupler self align to the semiconductor chip. The first portion and the second portion of the passage are laterally displaced relative to each other with the emulation adapter connecting the test handler positioner and the chip coupler. The emulation adapter includes an adapter plate that provides a slot extending laterally from a first position overlapping the first opening provided by the test handler positioner to a second position overlapping the second opening provided by the chip coupler. The emulation adapter is configured to connect to directly connect to the chip coupler of the second type, the chip coupler being one of a Synax chip coupler and a Seiko-Epson chip coupler.

In general, in another aspect, the invention provides an adapter kit for connecting test handler positioners to a chip coupler for use in selectively coupling to and moving semiconductor chips, the adapter kit including an interface plate configured to attach to a test handler positioner that is configured to attach to a corresponding chip coupler of a first type, the test handler positioner being incompatible for direct connection to at least chip couplers of second and third types, different from the first type, and connecting means for mechanically and functionally connecting the interface plate with the chip couplers of the second and third types.

Implementations of the invention may include one or more of the following features. The connecting means includes multiple different adapter plates configured to directly connect to the chip couplers of the second and third types. At least one of the adapter plates provides a slot that extends laterally and overlaps with a first opening in the interface plate and overlaps with a second opening provided in at least one of the chip couplers, the at least one adapter plate providing a through hole in alignment with the second opening.

In general, in another aspect, the invention provides a test handler emulator including a housing providing a substantially horizontal portion for supporting a tray of semiconductor chips, a positioner connected to the housing and configured to move horizontally and vertically relative to the substantially horizontal portion of the housing, a controller communicatively coupled to the positioner configured to control movement of the positioner, and an emulation adapter configured to mechanically connect to the positioner and to a chip coupler for coupling to a semiconductor chip, the chip coupler being incompatible with direct connection to the positioner, the emulation adapter being configured to directly connect to the positioner and to directly connect to the chip coupler, the emulation adapter being further configured to provide fluid communication between the positioner and the chip coupler by providing a passage through the emulation adapter that provides a first portion in alignment with a first opening provided by the positioner and a second portion in alignment with a second opening provided by the chip coupler.

Implementations of the invention may include one or more of the following features. The emulation adapter is configured to couple to up to four chip couplers.

Various aspects of the invention may provide one or more of the following capabilities. A single test handler can be made to look like several, different test handlers. Cost can be reduced for testing semiconductor chips by reducing the number of test handlers needed to be purchased. A test handler can be emulated by a lower-cost system.

These and other capabilities of the invention, along with the invention itself, will be more fully understood after a review of the following figures, detailed description, and claims.

DETAILED DESCRIPTION OF PREFERRED EMBODIMENTS

Embodiments of the invention provide techniques for emulating test handlers. For example, different semiconductor chip test handlers can be emulated using a single test handler and an emulation adapter. An interface plate is connected to a test handler and an adapter plate is connected to the interface plate. The adapter plate is configured to have a chip coupler connected to it, possibly by connecting to a compliance assembly that is connected to the adapter plate, the type of which depends upon the type of the chip coupler. Different chip couplers may be connected to the interface plate through different adapter plates. Other embodiments are within the scope of the invention.

Figure 1:
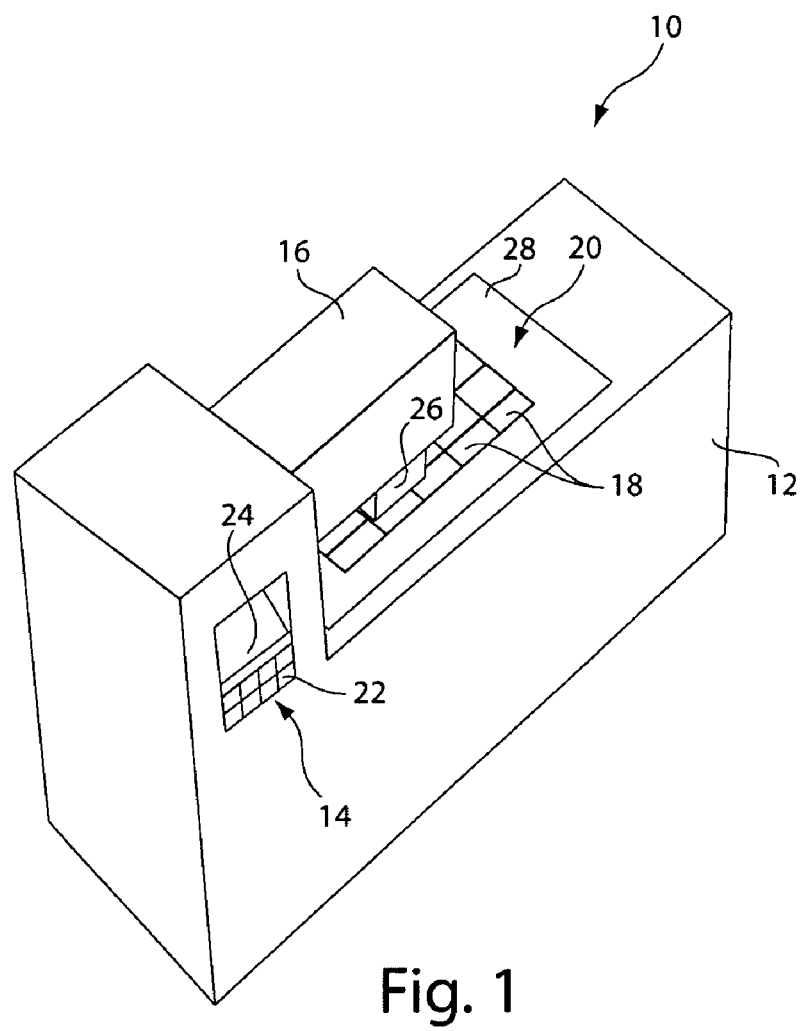
FIG. 1 is a simplified diagram of a generic test handler.

Referring to FIG. 1, a test handler 10 includes a housing 12, a controller interface 14, and a test piece positioner 16. The test handler 10 may be a fully automated, high-volume production test handler (e.g., made by Shinano Electronics Company Ltd. (Synax) of Matsumoto, Japan, by Delta Design of San Diego, Calif., by Seiko-Epson Corporation of Nagano, Japan, or by others). The test handler 10 may also be a test handler emulator made by Northwave™ Equipment Corporation of West Newbury, Mass. (Model EM 1™), that is a relatively low-cost, automated tool configured to emulate the functioning and test site of more complex, expensive, fully automated, high-volume test handlers. The term test handler as used throughout this document (above and below) refers to the high-volume test handlers and/or the test handler emulators. The controller interface 14 includes a keypad 22 and a display 24 and is configured to be operated by a user to interact with a controller in the housing 12. The controller can communicate with other portions of the handler 10. The interface 14 can be operated by the user to control the handler 10, including the positioner 16 (e.g., to control movement of the positioner 16). For example, the user can program the handler 10 for automatic operation or can override automatic operation for manual operation using the controller interface 14. The positioner 16 is releasably connected to a test piece coupler 26 for selectively attaching to and releasing the test pieces 18 to position the test pieces 18 for testing. Different handlers made by different manufacturers have different configurations and designs for their housings, controller interfaces, positioners, and test piece couplers. The test piece couplers are designed to mate with the positioners of the same manufacturer, and do not fit to positioners of other manufacturers. The handler 10, however, includes a test handler adapter such that the handler 10 can be treated as a generic handler, with different manufacturer's test piece couplers able to be connected to and used with the positioner 16.

The test handler 10 is configured to select test pieces 18 from a test piece array 20 on a tray 28, position the test pieces 18 for testing, test the pieces 18, and sort the tested pieces 18. The housing 12 provides a relatively flat surface that supports the tray 28. The positioner 16 can move horizontally and vertically relative to the housing 12 under the control of the controller in the housing 12. The handler 10 is configured to remove a selected piece 18 from the array 20, place the selected test piece 18 into a calibration position, move the test piece 18 from the calibration position to a test position, and test the piece 18. The handler 10 is further configured to move the test piece 18 back to the calibration position, and sort the tested piece 18 into good or bad, placing the piece 18 into a corresponding output set based on whether the test piece passed or failed the testing. The handler 10 may be configured to select, position, and/or test multiple pieces 18 at a time.

Figure 2:
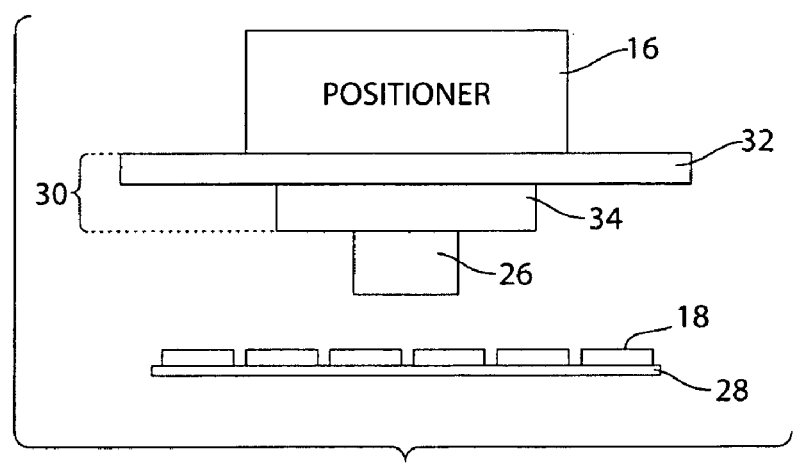
FIG. 2 is a simplified side view of a portion of the generic test handler shown in FIG. 1.

Referring also to FIG. 2, the test piece coupler 26 may be incompatible for direct connection to the positioner 16, but is connectable to the positioner 16 through an emulation adapter 30. While the coupler 26 and the positioner 16 could be attached, e.g., by taping them together, they may not be designed to be directly attached. For example, screw holes for attaching the coupler 26 to a positioner may not align with, and/or may be different sizes than, screw holes in the positioner 16 for attaching to a coupler. Alternatively, the coupler 26 and the positioner 16 may be designed for different means of attachment (e.g., screws versus clips). As used in this document, a direct connection between two parts does not require physical contact of those two parts. For example, the two parts may be separated by a shim or other item. Parts are configured for direct connection, for example, if they have screw holes that align for receiving screws to provide a physical connection between the two parts, or if the parts provide members for being clipped to each other, etc.

The test handler adapter 30 here includes an interface plate 32 and an adapter plate 34. The adapter 30 is configured to emulate the appropriate positioner for the coupler 26, and thus to emulate the appropriate test handler for the coupler 26. The adapter 30 emulates the appropriate positioner by mechanically connecting to the test piece coupler 26 in accordance with the mechanical layout of the coupler 26 (e.g., with appropriately sized and disposed holes for screws, or other connecting apparatus such as lips for buckles or clips). The adapter 30 further emulates the appropriate positioner by functionally connecting the positioner 16 and the coupler 26 by providing other appropriate features such as an air passage for providing a vacuum (e.g., of about 15 psi) for use in selectively picking up and dropping the test pieces 18. Different configurations of the adapter 30, e.g., different configurations of the interface plate 32 and/or adapter plate 34, are used to emulate different test handlers for different test piece couplers. Preferably, the interface plate 32 for use with a given test handler is generic to multiple adapter plates 34 and the adapter 30 can be adapted to attach to different test piece couplers to emulate different test handlers by changing which adapter plate 34 is used.

Figure 3:
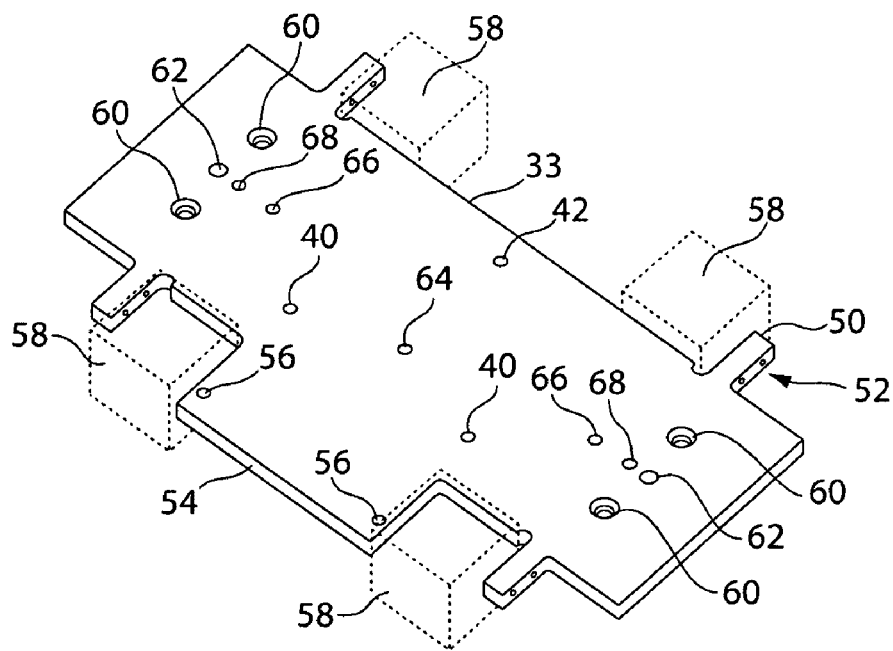
FIG. 3 is a top perspective view of an interface plate shown in FIG. 2.
Figure 4:
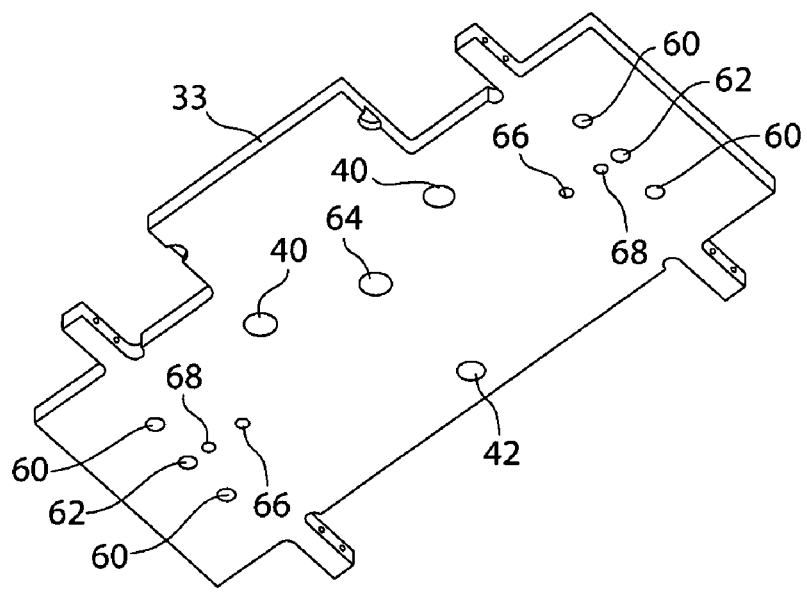
FIG. 4 is a bottom perspective view of the interface plate shown in FIG. 3.

Referring to FIGS. 3–4, an interface plate 33, that is an exemplary embodiment of the interface plate 32 shown in FIG. 2, is configured to mechanically attach to a positioner of the EM 1 test handler made by Northwave Technology, Inc. The interface plate 33 preferably includes counter-bored holes 40, 56 for receiving screws, with the holes 40, 56 being aligned with threaded holes in a frame of the EM 1 positioner. The plate 33 also provides countersunk holes 42 and 64 for attaching/mounting to a valve stack of the EM 1 positioner that provides a vacuum for use in coupling to and picking up test pieces.

The plate 33 is further configured to connect to pick and place air cylinders 58. The plate 33 includes arms 50 that provide holes 52 through which screws may be inserted and screwed into the air cylinders 58. The air cylinders 58 are shown in simplified form as boxes for illustrative purposes only. The pick and place air cylinders 58 are configured to pick up and release the test pieces in conjunction with operation of the positioner to move the test pieces from the array 20 (FIG. 1) to the calibration position, and from the calibration position to an output position based on whether the particular test pieces passed or failed testing. While four air cylinders 58 are shown in FIG. 3, other quantities of the cylinders 58 may be used.

The plate 33 is also configured to connect to various adapter plates and to provide fluid communication between the EM 1 positioner and various adapter plates. The plate 33 provides four counter-bored holes 60 and two post holes 62. The holes 60 are configured to receive screws for connecting to an adapter plate for use with a Seiko Epson test piece coupler (see FIGS. 7–8 and associated description below) or an adapter plate for use with a Synax test piece coupler. The post holes 62 are configured to receive posts (alignment pins) extending from the Seiko-Epson adapter plate or the Synax adapter plate. Passages 66, 68 are also provided in the plate 33 for providing fluid communication between the positioner and adapter plates such that the positioner can provide a vacuum to the chip coupler(s) that is(are) connected through the adapter plate. Preferably one each of the holes 66, 68 are fluidly connected to each test piece coupler such that four test piece couplers can be fluidly connected through the interface plate 33. The interface plate is preferably made of a thermally insulative material such as Garolite G11.

Figure 5:
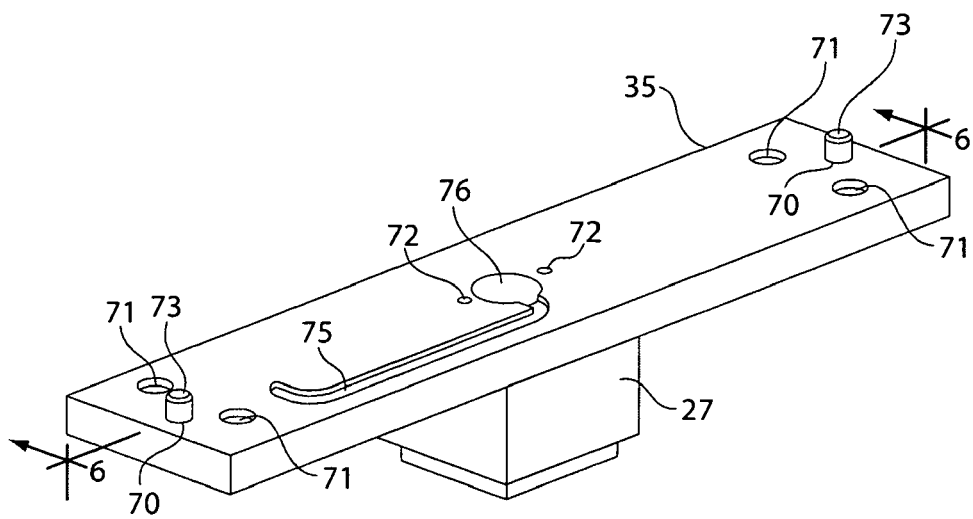
FIG. 5 is a perspective view of an adapter plate and an exemplary test piece coupler.
Figure 6:
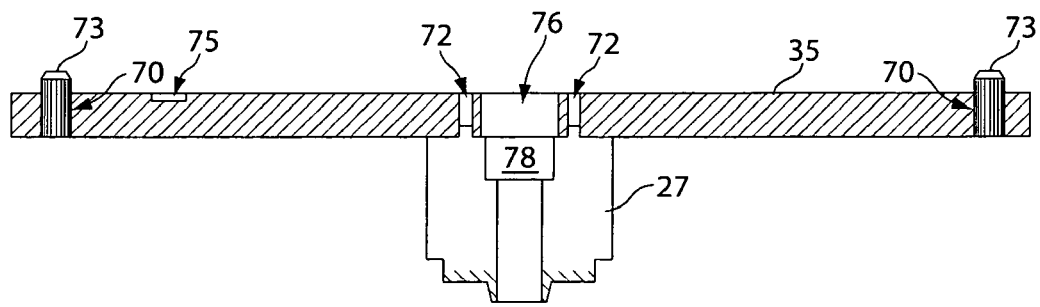
FIG. 6 is a cross-sectional view of the adapter plate and test piece coupler shown in FIG. 5 viewed along line 6—6 in FIG. 5.

Referring to FIGS. 2–6, an adapter plate 35 shown in FIGS. 5–6, that is an exemplary embodiment of the adapter plate 34 shown in FIG. 2, is configured to adapt the interface plate 33 to a chip coupler 27. The chip coupler 27 here is a Synax work press made by Shinano Electronics Company Ltd. (Synax) of Matsumoto, Japan. The test piece coupler 27 includes a movable head to help with self-alignment of the coupler 27 to the test pieces 18 so the adapter plate 35 preferably is a solid piece of material and is preferably directly connected to the coupler 27, e.g., without an intermediate compliance assembly (see below) for providing movement to assist with test piece alignment. The adapter plate 35 is preferably a machined, unitary piece of thermally insulative material such as Garolite G11. The adapter plate 35 provides alignment pin holes 70 for receiving alignment pins/posts 73 and holes 71 for receiving fasteners such as screws for connecting to the interface plate 33. The holes 70, 71 are arranged to align with the holes 62, 60 in the interface plate 33. The adapter plate 35 further provides coupler alignment holes 72 for receiving alignment pins of the coupler 27 and are sized such that these pins are received by the holes 72 with a slip fit. The adapter plate 35 provides appropriate means for being attached to the coupler 27, e.g., holes for receiving screws that can be screwed into the coupler 27.

The adapter plate 35 also provides a slot 75 and a passage 76 for fluid communication between the interface plate 33 and the test piece coupler 27. The slot 75 is substantially C-shaped with one end disposed in alignment with one of the holes 66, 68 in the interface plate 33 when attached to the plate 33, and the other end terminating at the passage 76. The passage 76 is disposed in alignment with a cavity 78 in the test piece coupler 27 when the plate 35 is attached to the coupler 27. The cavity 78 is configured to permit a vacuum sufficient to pick up the work piece 18 when contacted by the coupler 27. The passage 76 is disposed and sized to permit/maintain the vacuum through the adapter plate 35 such that a sufficient vacuum (e.g., 15 psi) can be produced by the positioner 16 and conveyed through the interface plate 33, the adapter plate 35, and the coupler 27 to the test piece 18.

Figure 7:
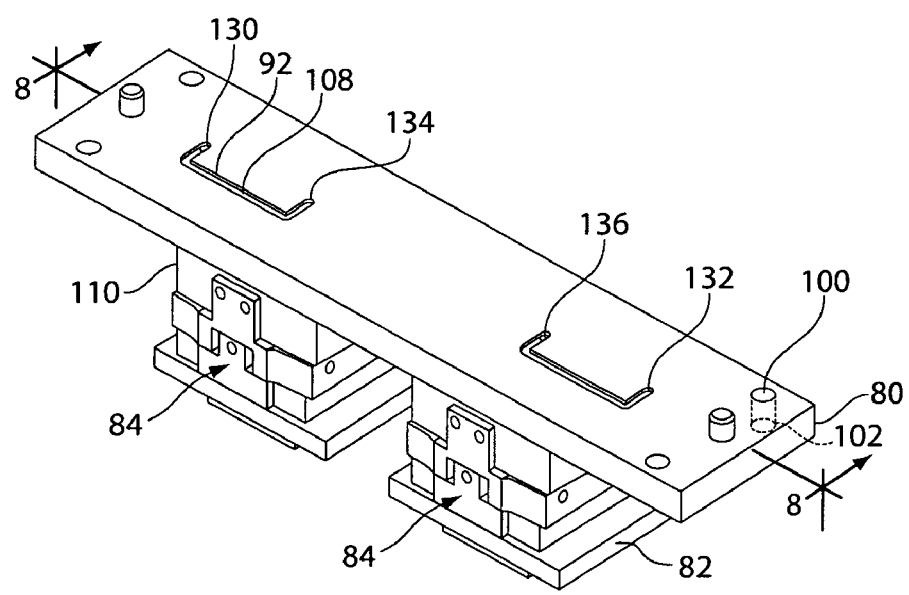
FIG. 7 is a perspective view of an alternative adapter and alternative test piece couplers.
Figure 8:
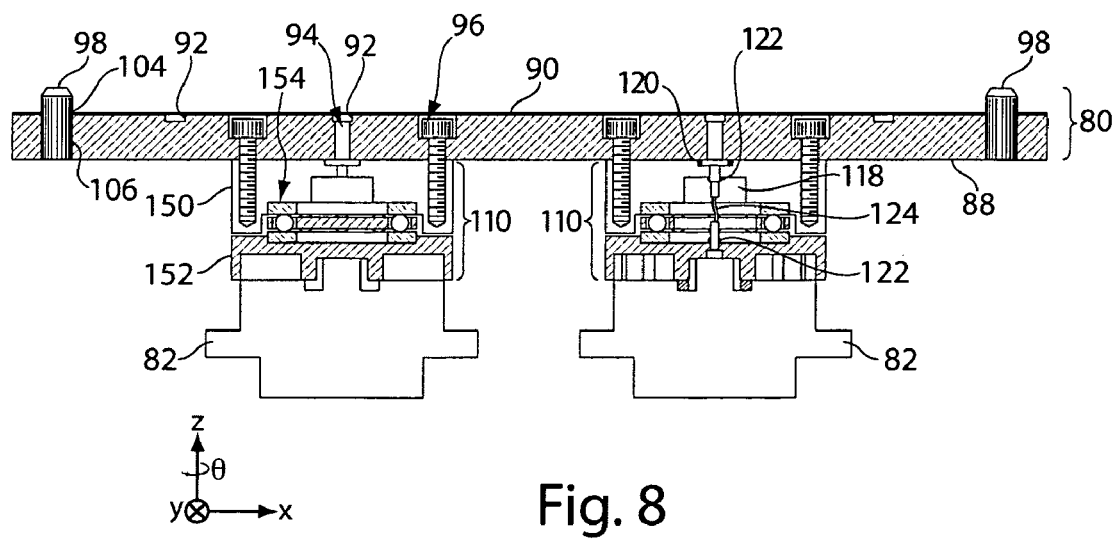
FIG. 8 is a cross-sectional view of the adapter and test piece couplers shown in FIG. 7 viewed along line 8—8 in FIG. 7.

Referring to FIGS. 2–8, an adapter assembly 80 shown in FIGS. 7–8, that is an exemplary embodiment of the adapter plate 34 shown in FIG. 2, is configured to adapt the interface plate 33 to test piece couplers 82, which here are blade packs made by Seiko-Epson Corporation of Nagano, Japan. The couplers 82 are incompatible for direct connection to the positioner 16, but are connectable to the positioner 16 through the adapter assembly 80 and the interface plate 33. Each of the couplers 82 includes a clip 84 for releasably connecting to a compliance assembly 110 that is connected to the adapter 80. Some items of the compliance assemblies 110 are not shown in the compliance assembly 110 on the left side of FIG. 8 for clarity purposes only, but the assemblies 110 are preferably similarly configured. Each of the compliance assemblies 110 provides for movement of the coupler 82 relative to the adapter 80 to help with self-alignment of the coupler 82 to the test pieces 18. The adapter 80 includes a bottom plate 88, a gasket 90 (e.g., made of silicone), and posts 98. The bottom plate 88 is preferably a machined, unitary piece of thermally insulative material such as Garolite G11.

The bottom plate 88, the gasket 90, and the posts (alignment pins) 98 of the adapter 80 are configured and arranged to releasably connect to the interface plate 32. The plate 88 and the gasket 90 provide interface mounting holes 100, 102 (only one shown in FIG. 7), respectively, for receiving fasteners such as screws for connecting to the interface plate 32. Preferably, the holes 102 in the bottom plate 88 are threaded for receiving the connector screws. The holes 100, 102 are disposed to align with the holes 60 of the interface plate 33 and sized to receive screws inserted through the holes 60 to connect the interface plate 33 to the adapter 80. The plate 88 and the gasket 90 also provide post holes 104, 106 for snugly receiving the posts 98 (e.g., with a press fit). The post holes 104, 106 are aligned, and the posts 98 sized, such that the posts 98 fit into the post holes 62 in the interface plate (FIGS. 3–4) with the adapter 80 connected to the interface plate 33.

The bottom plate 88 and the gasket 90 of the adapter 80 also provide a mechanism for fluid communication between the interface plate 33 and the chip coupler 82. Slots 92, 108 are provided in the bottom plate 88 and the gasket 90, respectively. The slots 92, 108 run from first ends 130, 132 to second ends 134, 136. The first ends 130, 132 of the slots 92, 108 are disposed to align with the passages 66 in the interface plate 32 (FIGS. 3–4) such that the passages 66 and the slots 92, 108 overlap when the adapter 80 is connected to the interface plate 33. The second ends 134, 136 are disposed to align with passages 118 in the compliance assemblies 110 such that the slots 92, 108 and the passages 118 overlap when the compliance assemblies 110 are connected to the adapter 80. Through holes 94 are provided at the second ends 134, 136 of the slots 92 in the bottom plate 88 to provide fluid communication from the gasket 90 to the compliance assemblies 110. The slots 92, 108, and the holes 94 are configured to permit a vacuum sufficient to pick up the work piece 18 when contacted by the coupler 82, e.g., being sized to permit/maintain a vacuum of about 15 psi through the slots 92, 108, and the holes 94.

Each of the compliance assemblies 110 includes a seal 120, barb fittings 122, and a tube 124 for providing fluid communication from the adapter 80 to the test piece coupler 82. The seal 120 is preferably a rubber O-ring that helps ensure an air-tight connection between the plate 88 and the compliance assembly 110. The barb fittings 122 are hollow and are connected to the tubing 124 to provide for fluid communication from the hole 94 in the plate 88, through the top barb fitting 122, through the tubing 124, through the bottom barb fitting 122, to the test piece coupler 82. The tubing 124 is flexible to allow for movement of the compliance assembly, e.g., being made of silicone.

Each of the compliance assemblies 110 also includes an upper, fixed compliance mounting plate 150, a lower, movable compliance plate 152, and a thrust bearing 154 movably coupling the upper and lower plates 150, 152. The thrust bearings 154 connect the plates 150, 152 such that the plates are separated from each other in the z-direction by a substantially constant distance. The thrust bearings 154 are configured to allow the plates 150, 152 to move relative to each other in the ±x-directions, ±y-directions, and ±Θ directions. The movement of the plates 150, 152 allows the couplers 82 to move relative to the assembly 80, and thus the positioner 16 to help self-align the couplers 82 with the test pieces 18.

Offsets may need to be provided for test programs due to physical differences using embodiments of the invention and using mating test handlers and test piece couplers. For example, using the interface plate 33 and either the adapter plate 35 or the compliance assemblies 110 and the adapter 80 may result in the test piece couplers 27, 82 being at different heights relative to the positioner 16 than if the test handler for which the couplers 27, 82 were designed to mate is used. Thus, height offsets may be entered into test programs through the controller interface 14 (FIG. 1) such that the test program is adapted to the change in expected physical location of the test piece couplers 27, 82 so the couplers 27, 82 will be able to select the test pieces 18 in a desired manner.

Figure 9:
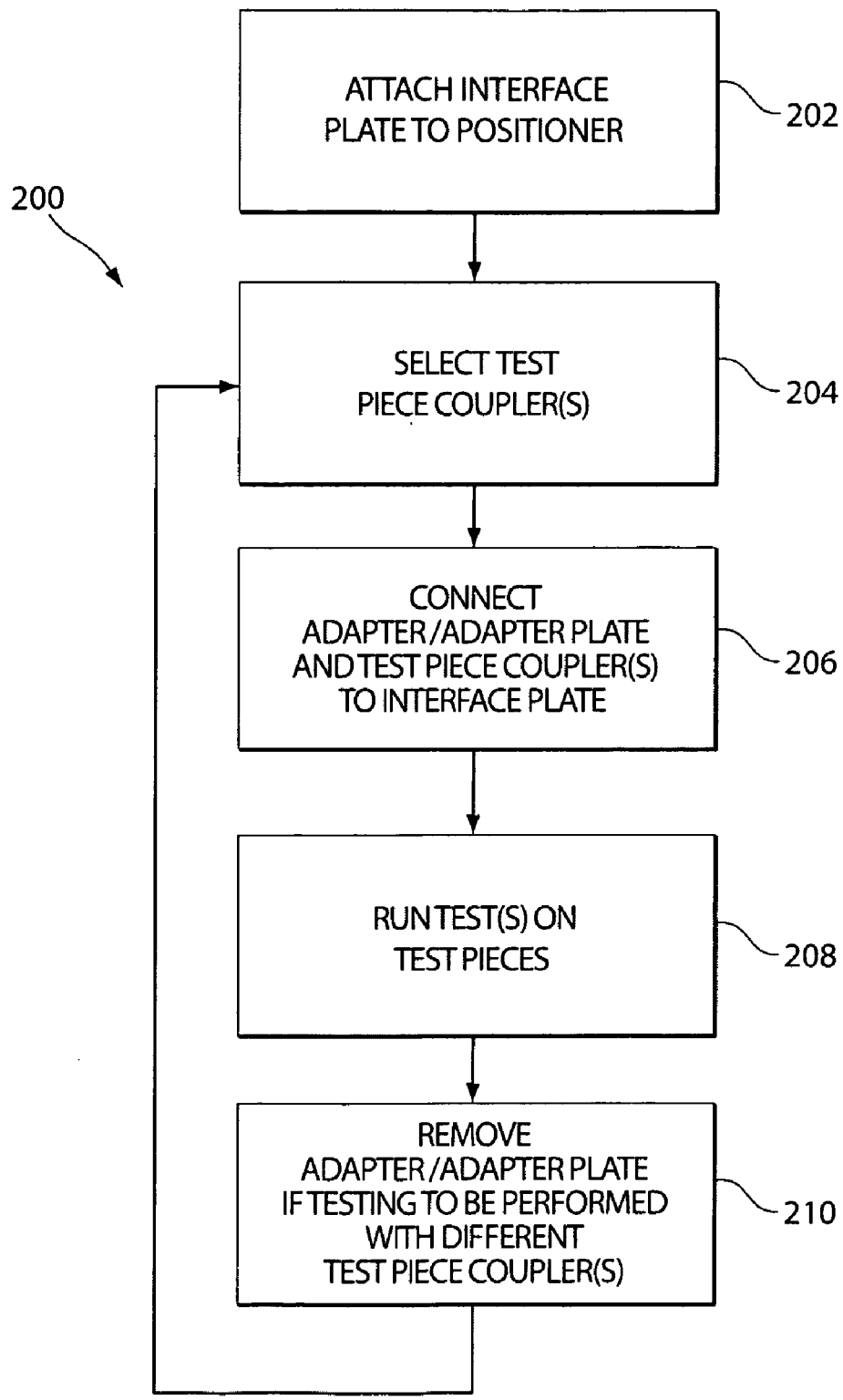
FIG. 9 is a block flow diagram of a process of emulating different test handlers and testing test pieces using different test piece couplers with the same test handler.

In operation, referring to FIG. 9, with further reference to FIGS. 1–8, a process 200 for emulating test handlers using the system 10, the adapter 80, the compliance assemblies 110, and the test piece couplers 27, 82 includes the stages shown. The process 200, however, is exemplary only and not limiting. The process 200 may be altered, e.g., by having stages added, removed, or rearranged.

At stage 202, a user of the test handler 10 attaches the interface plate 32 to the positioner 16. Depending on the make/model of the positioner, the user may attach the plate 32 to the positioner differently. For example, for the EM 1 test handler, the user inserts screws through the holes 40, 56 of the interface assembly into the frame of the positioner 16 and inserts screws through the holes 42, 64 into the EM 1 valve stack and tightens the screws. The user also screws one or more of the pick and place air cylinders 58 to the plate 33 using screws inserted through the holes 52 in the appropriate arm(s) 50.

At stage 204, the user of the test handler 10 selects one or more test piece couplers 26 to use in testing the work pieces 18. The user selects the coupler(s) 26 corresponding to the test handler that is to be used by a particular manufacturer for testing the particular test pieces 18.

At stage 206, the user connects the appropriate adapter 30 to the selected test piece coupler(s) 26 and the interface plate 32. The user may choose an appropriate adapter 30 or portions of an adapter 30 from an emulator kit (an EMKIT™). For example, if the user selected the test piece coupler 27, then the user connects the adapter plate 35 to the coupler 27 by screwing the adapter plate 35 onto the coupler 27, with the alignment pins 73 fitting into the holes 62. If the user selected the test piece couplers 82, then the user screws the bottom plate 88 to the compliance assemblies 110 and clips the compliance assemblies 110 to the couplers 82. The user also places the gasket 90 over the bottom plate 88 and screws the interface plate 33 to the bottom plate through the interface plate holes 60 and the threaded bottom plate holes 100, with the alignment pins 98 fitting into the holes 62.

At stage 208, the tests are run on the test pieces 18. The interface plate 33 and either the adapter 80 and the compliance assemblies 110, or the adapter plate 35, emulates the test handler corresponding to the respective couplers 82, 27, e.g., by positioning the couplers 82, 27 and providing vacuums similarly to the appropriate test handlers. The air cylinders 58 are used to move the test pieces from the array 20 to an intermediate position. The test piece couplers 82, 27 are used to move the test pieces 18 from the intermediate positions to desired test locations, and from the test locations back to the intermediate positions. The air cylinders 58 are used to move the test pieces 18 from the intermediate positions to "good" or "bad" output bins depending upon the results of tests conducted with the test pieces 18 at the test locations. The test piece couplers 82, 27 may or may not release the test pieces 18 during testing (while the test handler runs tests on the test pieces 18). The user operates the system 10, with the configuration that the user has set up, using the controller interface 14. The user may input appropriate offsets, e.g., to account for height differences between the setups using the interface plate 33, and the adapter 80 and the compliance assemblies 110, or the adapter plate 35, and the setup connecting the couplers 82, 27 directly to their mating test handlers.

At stage 210, the user removes the adapter 30, here the adapter 80 or the adapter plate 35, if testing is to be performed with a different test piece coupler 26. The process 200 returns to stage 204 where the new test piece coupler 26 is selected and to stage 206 where the appropriate adaptation is made to the system 10 to emulate the appropriate test handler using the same test handler as used for the previously selected test piece coupler(s) 26. Appropriate adaptation includes connecting a different emulation adapter 30, which may involve only using a different adapter plate 34, or more of a change in the emulation adapter used.

Other embodiments are within the scope and spirit of the appended claims. For example, while the adapter plate 34 is shown configured to connect to the single work press 26 and the bottom plate 88 of the adapter assembly 80 is shown configured to connect to a 1×2 array of the work presses 82, other arrangements of adapters may be used. For example, a 2×2 array or a 1×4 array of work presses may be used with an appropriate adapter. Further, while the description focused on adapting work presses and positioners that are incompatible for direct connection, adapters may be used to connect compatible work presses and positioners, e.g., to avoid removing and replacing interface plates. Also, while the adapter 30 was shown as including the interface plate 32 and either the adapter plate 34 or the adapter assembly 80, other configurations of the adapter 30 are possible, including single-piece adapters (e.g., combining the plates 32 and 34). While the description of the interface plate 33, as an example of the interface plate 32, focused on connecting to the EM 1 test handler and to adapter plates for a Seiko-Epson test piece coupler and a Synax test piece coupler, other forms of the interface plate 32 are possible. Embodiments of the interface plate 32 may be configured to attach to other test handlers, and/or to connect to adapter plates for use with test piece couplers of other configurations (e.g., made by other manufacturers). For example, the invention could be used with test handlers and/or test piece couplers made by Delta Design, Multitest AG (part of Everett Charles Technologies, a subsidiary of Dover Technologies and Dover Corporation), etc.

What is claimed is:

1. An emulation adapter for use with a semiconductor chip test handler, the emulation adapter being configured to:
   mechanically connect to a test handler positioner of a first type and to a chip coupler for coupling to a semiconductor chip, the chip coupler being of a second type that is incompatible with direct connection to the test handler positioner of the first type;
   directly connect to the test handler positioner of the first type and to directly connect to the chip coupler of the second type;
   provide fluid communication between the test handler positioner of the first type and the chip coupler of the second type by providing a passage through the emulation adapter with a first portion of the passage in alignment with a first opening provided by the test handler positioner of the first type and a second portion of the passage in alignment with a second opening provided by the chip coupler of the second type, wherein the emulation adapter includes a first plate configured to attach to the test handler positioner and a second plate configured to attach to the chip coupler.

2. The emulation adapter of claim 1 wherein the first plate provides the first portion of the passage and the second plate provides the second portion of the passage, and wherein portions of the passage provided by the first and second plates overlap with the first and second plates connected to form portions of the emulation adapter.

3. The emulation adapter of claim 2 further including a gasket configured to be disposed between the first and second plates.

4. The emulation adapter of claim 1 wherein at least one of the first and second plates is made of a thermally insulative material.

5. The emulation adapter of claim 4 wherein the thermally insulative material is Garolite G11.

6. An emulation adapter for use with a semiconductor chip test handler, the emulation adapter being configured to:
  mechanically connect to a test handler positioner of a first type and to a chip coupler for coupling to a semiconductor chip, the chip coupler being of a second type that is incompatible with direct connection to the test handler positioner of the first type;
  directly connect to the test handler positioner of the first type and to directly connect to the chip coupler of the second type;
  provide fluid communication between the test handler positioner of the first type and the chip coupler of the second type by providing a passage through the emulation adapter with a first portion of the passage in alignment with a first opening provided by the test handler positioner of the first type and a second portion of the passage in alignment with a second opening provided by the chip coupler of the second type, wherein the emulation adapter includes an adapter plate that provides a slot extending laterally from a first position overlapping the first opening provided by the test handler positioner to a second position overlapping the second opening provided by the chip coupler.

* * * * *